(12) United States Patent
Lee et al.

(10) Patent No.: US 7,044,197 B2
(45) Date of Patent: May 16, 2006

(54) HEAT SINK WITH COMBINED FINS

(75) Inventors: Hsieh Kun Lee, Tu-Chen (TW); WanLin Xia, Shenzhen (CN); Tao Li, Shenzhen (CN); Lei Li, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 102 days.

(21) Appl. No.: 10/748,313

(22) Filed: Dec. 29, 2003

(65) Prior Publication Data
US 2004/0194925 A1 Oct. 7, 2004

(30) Foreign Application Priority Data
Dec. 27, 2002 (TW) .............................. 91221269 U

(51) Int. Cl.
*H05K 7/20* (2006.01)
(52) U.S. Cl. ..................... 165/80.3; 361/704; 361/710
(58) Field of Classification Search ............... 165/80.3, 165/185; 361/704, 710
See application file for complete search history.

(56) References Cited
U.S. PATENT DOCUMENTS
6,449,160 B1 * 9/2002 Tsai .......................... 361/709
6,607,023 B1 * 8/2003 Ho et al. ..................... 165/78
6,766,851 B1 * 7/2004 Lo ............................. 165/185
6,766,852 B1 * 7/2004 Chen .......................... 165/185
6,772,828 B1 * 8/2004 Chen .......................... 165/78

FOREIGN PATENT DOCUMENTS
| CN | 00209935.7 | 1/2001 |
| CN | 00254564.0 | 9/2001 |
| CN | 01223334.X | 4/2002 |
| TW | 390459 | 5/2000 |

* cited by examiner

*Primary Examiner*—Allen J. Flanigan
(74) *Attorney, Agent, or Firm*—Wei Te Chung

(57) ABSTRACT

A heat sink (1) includes a heat-conductive base (20), and a plurality of combined fins (10) uprightly attached onto the base. Each fin includes a main body (12), and a flange (14) extending perpendicularly from the main body. A pair of locking plates (16) is bent downwardly from an upper edge of the main body. A pair of blocking tabs (18) is stamped from the main body, corresponding to a middle portion of each locking plate. A receiving space is defined between said pair of blocking tabs and the main body. The locking plates and the blocking tabs are respectively located at opposite main faces of the main body. The locking plates of each fin are inserted in the receiving spaces of an adjacent fin, whereby the fins are firmly combined together.

13 Claims, 5 Drawing Sheets

HEAT SINK WITH COMBINED FINS

BACKGROUND OF THE INVENTION

1. Field of the Invention

The present invention relates to heat sinks, and particularly to a heat sink having high density fins in which the fins are firmly combined together.

2. Prior Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sinks are frequently used to dissipate heat from these electronic devices.

Contemporary CPUs are also being made smaller than previously. Thus a modern CPU can generate a huge amount of heat in a relatively small volume. A typical heat sink is integrally made by extruding aluminum. The heat sink has a base, and a plurality of spaced, parallel fins extending upwardly from the base. However, the width-to-height ratio of the heat sink is limited by the extrusion process. Thus, the effective heat-dissipating area of the heat sink is restricted.

In order to overcome the limitations of extrusion, a folded-fin structure for a heat sink has been devised. The folded-fin structure is integrally concertinaed, and is made by bending a single metal sheet. This kind of heat sink has no limitations on the width-to-height ratio of the fins. For example, Taiwan Pat. No. 390459 discloses a heat sink with folded fins. However, a total contact area between the fins and a heat conductive base of the heat sink is only half of an area of the base. Because the contact area is limited, transfer of heat from the base to the fins is correspondingly limited.

In order to overcome the above-described contact area problem, another kind of heat sink has been devised. The heat sink includes a plurality of stacked fins. Each fin is separately formed. The fins are then stacked together, and attached onto a base. This kind of heat sink provides a much larger contact area between the fins and a heat conductive base. For example, China Pat. No. 00209935.7 discloses combined heat sink fins. Each fin forms two flanges at upper and lower ends thereof. A plurality of tabs and a plurality of cutouts are formed at each flange of each fin. An indent portion is formed in each tab. The tabs of each fin are extended into corresponding cutouts of an adjacent fin. The indent portions prevent the tabs from escaping from the cutouts. All the fins are thereby combined together.

However, the combined fins are relatively loose, because the fins are combined together only by way of the tabs extending into cutouts. The combined fins are easily deformed, and difficult to keep intact during transportation or assembly. In addition, combining points of the fins are located at lower and upper ends of the fins, which creates an uneven contacting surface between the combined fins and a heat-conductive base. The uneven contacting surface comprises a plurality of recessed portions, and lowers the heat transfer efficiency of the heat sink.

An improved heat sink with combined fins which overcomes the above-mentioned problems is desired.

BRIEF SUMMARY OF THE INVENTION

Accordingly, an object of the present invention is to provide a heat sink having high density fins which can be configured to have any width-to-height ratio.

Another object of the present invention is to provide a heat sink having fins which are firmly combined together.

A further object of the present invention is to provide a heat sink having high density fins and locking structures for assembling the fins together and increasing a strength of the heat sink.

To achieve the above-mentioned objects, a heat sink of a preferred embodiment of the present invention comprises a heat-conductive base, and a plurality of combined fins uprightly attached onto the base. Each fin comprises a main body, and a flange extending perpendicularly from the main body. A pair of locking plates is bent downwardly from an upper edge of the main body. A pair of blocking tabs is stamped from the main body, corresponding to a middle portion of each locking plate. A receiving space is defined between said pair of blocking tabs and the main body. The locking plates and the blocking tabs are respectively located at opposite main faces of the main body. The locking plates of each fin are inserted in the receiving spaces of an adjacent fin, whereby the fins are firmly combined together.

Other objects, advantages and novel features of the present invention will be drawn from the following detailed description of the preferred embodiment of the present invention with the attached drawings, in which:

DESCRIPTION OF THE PREFERRED EMBODIMENT

Figure 1:
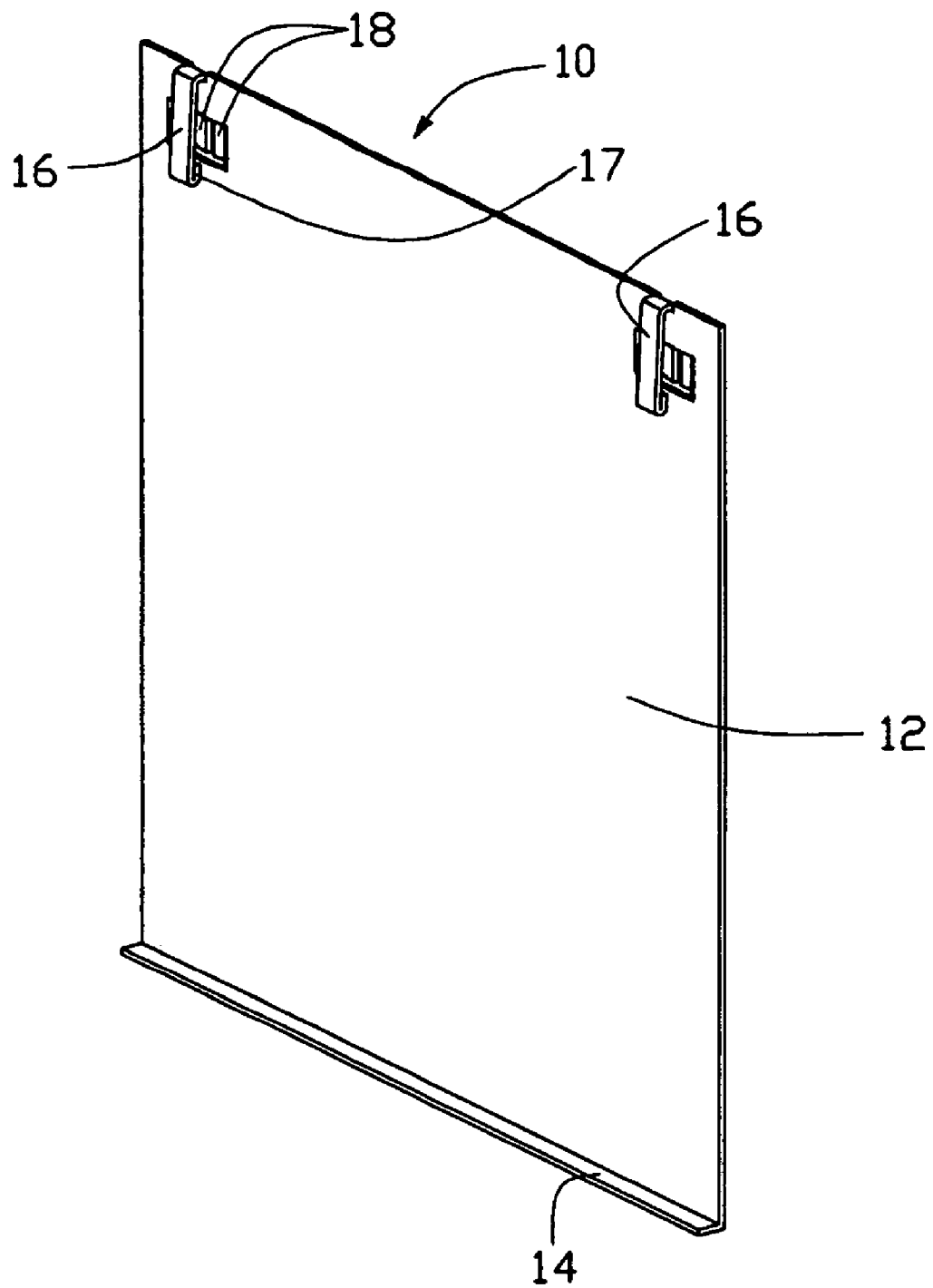
FIG. 1 is an isometric view of a fin of a heat sink in accordance with the preferred embodiment of the present invention.
Figure 2:
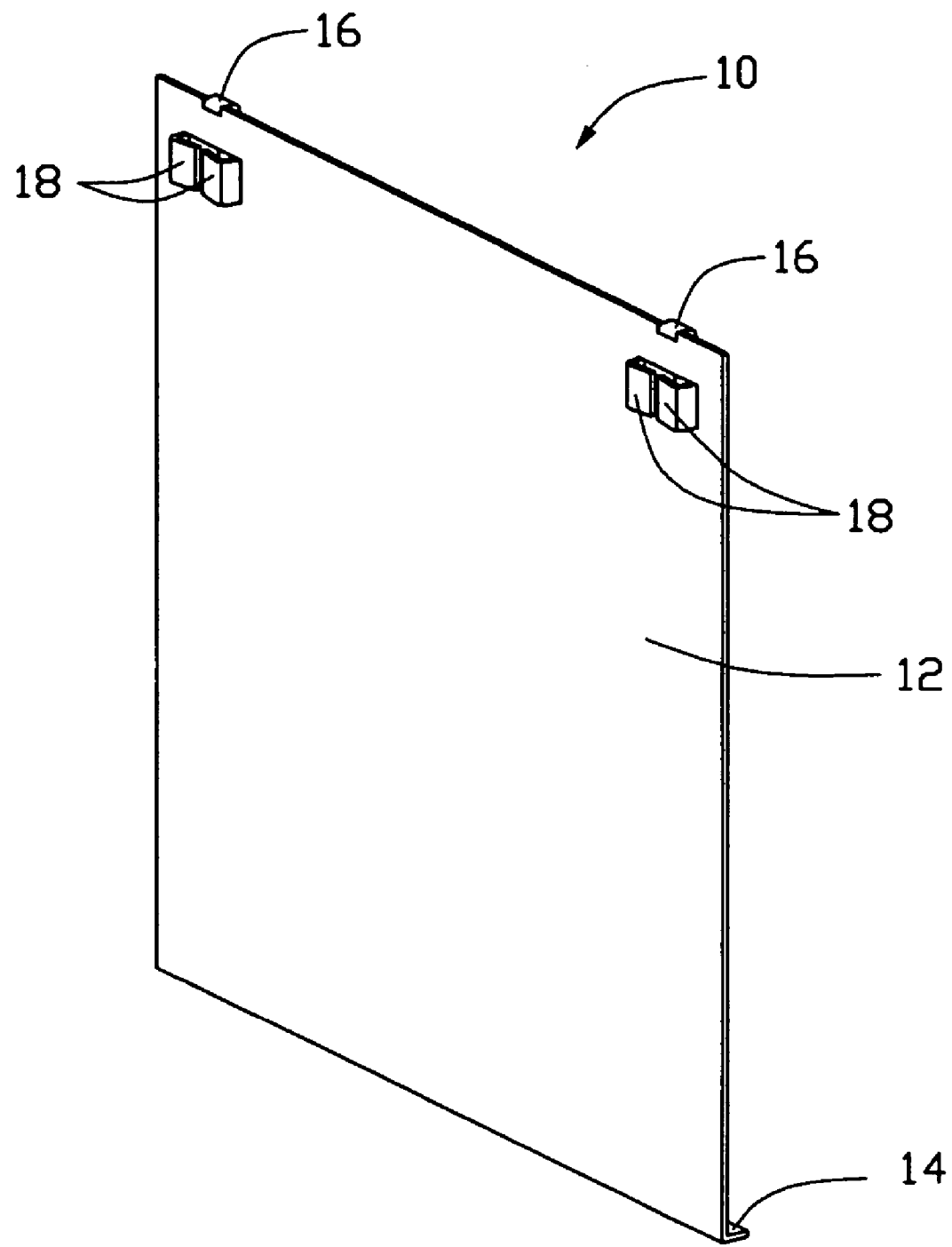
FIG. 2 is similar to FIG. 1, but viewed from another aspect.
Figure 3:
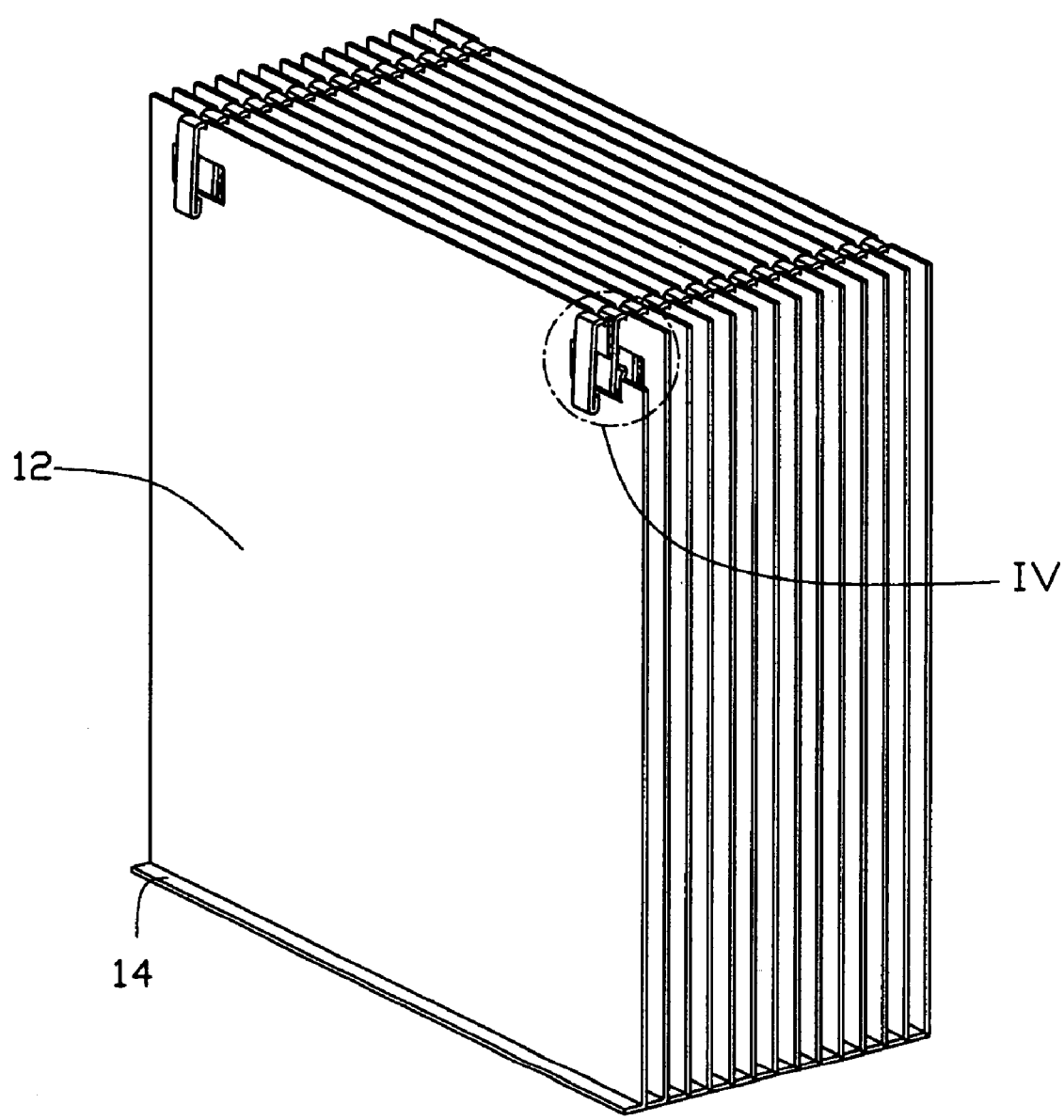
FIG. 3 is an isometric view of a plurality of the fins of FIG. 1 assembled together.
Figure 4:
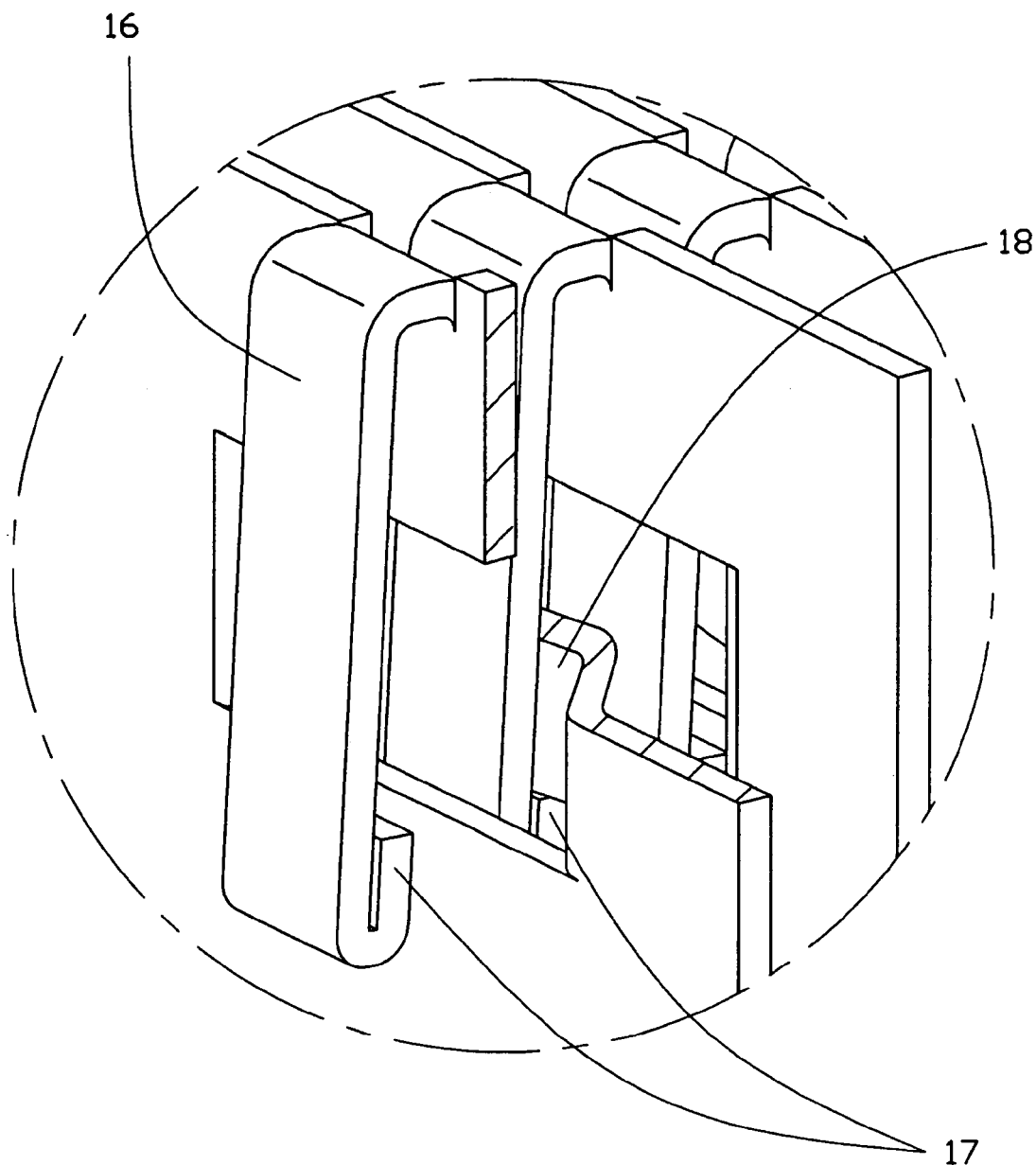
FIG. 4 is an enlarged view of an encircled portion IV of FIG. 3.
Figure 5:
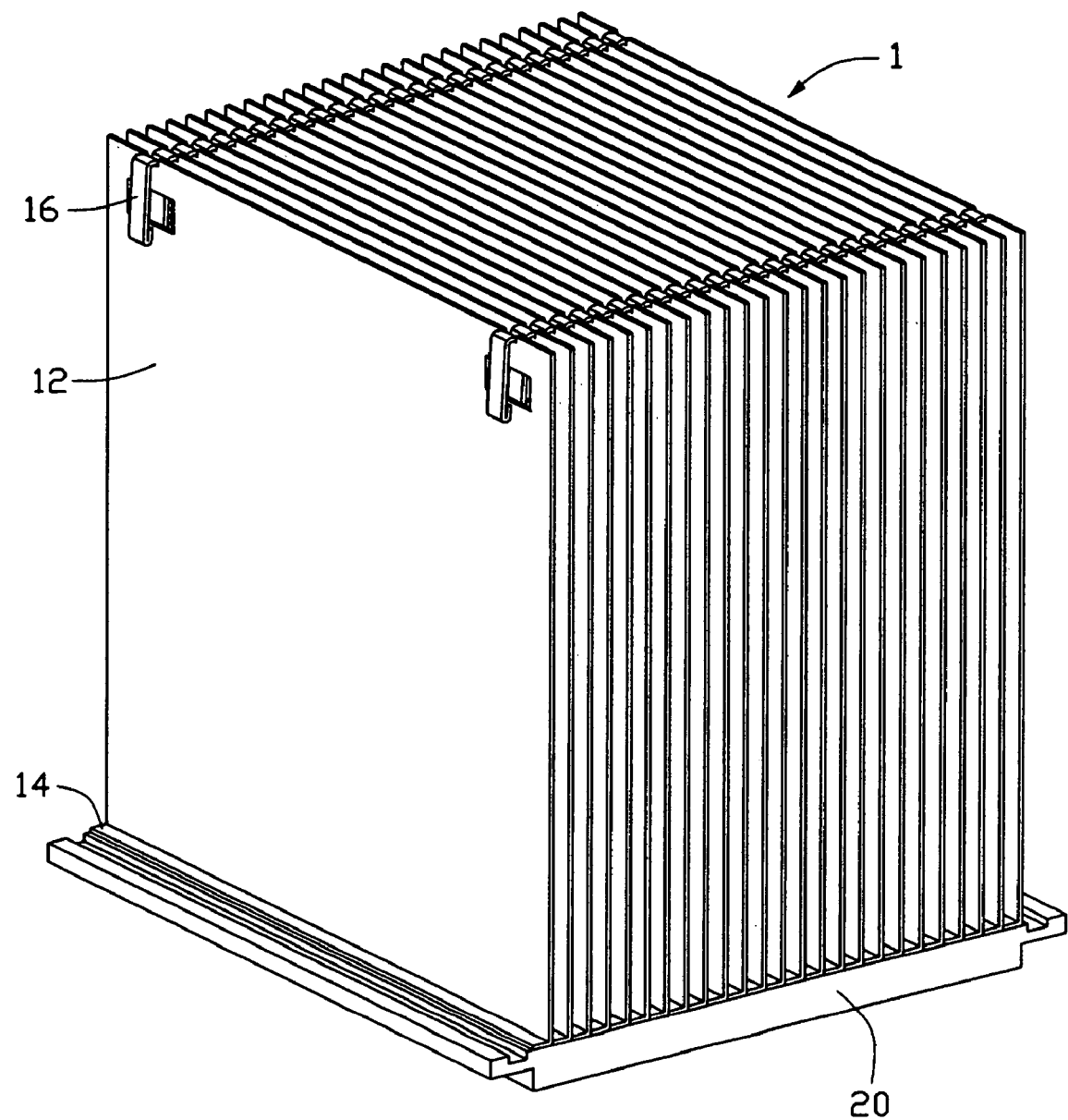
FIG. 5 is an isometric view of the heat sink in accordance with the preferred embodiment of the present invention.

Referring to FIGS. 1–5, a heat sink 1 in accordance with the preferred embodiment of the present invention is used to dissipate heat from a heat-generating element such as a CPU (not shown). The heat sink 1 comprises a heat-conductive base 20, and a plurality of combined fins 10 uprightly attached onto the base 20. Each fin 10 is formed by stamping a flat metal sheet.

Each fin 10 comprises a main body 12, and a flange 14 extending perpendicularly from a bottom end of the main body 12. Two locking plates 16 extend outwardly and then downwardly from opposite sides of a top edge of the main body 12 respectively. A folded portion 17 is formed inwardly from a distal end of each locking plate 16. The locking plates 16 are located at a same side of a first main face of the main body 12. A pair of L-shaped blocking tabs 18 is stamped from the main body 12 with an opening (not labeled) left in the main body 12, corresponding to middle portions of the locking plates 16 respectively. The blocking tabs 18 are located at a same side of an opposite second main face of the main body 12. The blocking tabs 18 in each pair of blocking tabs 18 extend toward each other and slightly toward the second main face of the main body 12. A receiving space is defined between each pair of blocking tabs 18 and the main body 12.

In assembly, the locking plates 16 of each fin 10 are inserted into the receiving spaces of an adjacent fin 10. The inwardly extending blocking tabs 18 of said adjacent fin 10 closely abut the corresponding locking plates 16. The folded portions 17 of the locking plates 16 of each fin 10 abut lower edges of the blocking tabs 18 of the adjacent fin, for preventing the locking plates 16 from escaping from the blocking tabs 18. The fins 10 are thereby firmly combined together. The flanges 14 of the fins 10 cooperatively form a surface for contacting the base 20. Then, the combined fins 10 are attached to the base 20 by means of welding or sintering.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink comprising:
   a heat-conductive base;
   a plurality of parallel fins attached onto the base, each of the fins comprising:
   a main body and a flange extending from a bottom of the main body, at least one locking plate extending downwardly from an upper portion of the main body, at least one blocking portion being formed at the main body corresponding to the at least one locking plate, wherein
   the at least one locking plate and the at least one blocking portion are respectively located at opposite main faces of the main body of each of the fins, and the at least one locking plate engages with the at least one blocking portion of an adjacent fin,
   wherein the main body and the at least one blocking portion of each of the fins cooperatively define at least one receiving space receiving the at least one locking plate of an adjacent fin; and
   wherein the at least one blocking portion comprises a pair of generally L-shaped blocking tabs extending toward each other.

2. The heat sink as described in claim 1, wherein said pair of blocking tabs extends slightly toward the main body, for clamping the at least one locking plate of an adjacent fin.

3. A heat sink comprising:
   a heat-conductive base;
   a plurality of parallel fins positioned upon the base, each of said fins including:
   a planar main body extending in a longitudinal direction;
   a blocking tab extending from the main body and being offset from the main body in a first lateral direction and defining a space therebetween; and
   a locking plate extending from the main body, adjacent to the blocking tab, and being offset from the main body in a second lateral direction opposite to said first lateral direction; wherein
   the locking plate of one fin is inserted into the space of a neighboring fin in the second lateral direction so as to prevent said one fin from being withdrawn from said neighboring fin in said first lateral direction.

4. The heat sink as described in claim 3, wherein the first lateral direction is perpendicular to said longitudinal direction.

5. The heat sink as described in claim 3, wherein the locking plate of said one fin is inserted into the space in a first vertical direction perpendicular to said first lateral direction.

6. The heat sink as described in claim 5, wherein said locking plate of said one fin includes an engagement portion latchably engaged with the blocking tab of said neighboring fin to prevent said one fin from being withdrawn from said neighboring fin in a second vertical direction opposite to said first vertical direction.

7. The heat sink as described in claim 5, wherein said first vertical direction is further perpendicular to said longitudinal direction.

8. The heat sink as described in claim 3, wherein the main body of each of said fins includes one flange extending from one edge of the main body in the second lateral direction and seated upon the base.

9. The heat sink as described in claim 8, wherein said flange and the corresponding locking plate are located far away from each other.

10. The heat sink as described in claim 3, wherein said blocking tab is directly stamped and split from the main body, leaving an opening in the corresponding main body.

11. The heat sink as described in claim 3, wherein said locking plate extends from one edge of the main body.

12. The heat sink as described in claim 9, wherein said locking plate extends from another edge of the corresponding main body opposite to said one edge of the corresponding main body.

13. A heat sink comprising:
    a heat-conductive base;
    a plurality of parallel fins attached onto the base, each of the fins comprising:
    a main body and a flange extending from a bottom of the main body, at least one locking plate extending downwardly from an upper portion of the main body, at least one blocking portion being formed at the main body corresponding to the at least one locking plate, wherein
    the at least one locking plate and the at least one blocking portion are respectively located at opposite main faces of the main body of each of the fins, and the at least one locking plate engages with the at least one blocking portion of an adjacent fin; and
    wherein a distal end of the at least one locking plate of each of the fins is bent inwardly and then upwardly to form a folded portion, the folded portion abutting a bottom of the at least one blocking portion of an adjacent fin.

* * * * *